United States Patent [19]
Bartels et al.

[11] Patent Number: 5,483,694
[45] Date of Patent: Jan. 9, 1996

[54] RADIO RECEIVER WITH AN INTERMODULATION DETECTOR

[75] Inventors: Stefan Bartels, Hildesheim; Jürgen Kässer, Diekholzen; Djahanyar Chahabadi, Hildesheim, all of Germany

[73] Assignee: Blaupunkt-Werke GmbH, Hildesheim, Germany

[21] Appl. No.: 164,127

[22] Filed: Dec. 8, 1993

[30] Foreign Application Priority Data

Dec. 9, 1992 [DE] Germany .......................... 42 41 362.1

[51] Int. Cl.⁶ ..................................................... H04B 1/10
[52] U.S. Cl. ...................... 455/295; 455/296; 455/306; 455/307; 455/311; 375/346
[58] Field of Search ...................... 455/63, 67.3, 232.1, 455/234.1, 234.2, 235.1, 236.1, 237.1, 295, 296, 308, 311; 375/98, 99, 344, 345, 346

[56] References Cited

U.S. PATENT DOCUMENTS

| | | | |
|---|---|---|---|
| 3,005,094 | 10/1961 | Taylor | 455/235.1 |
| 4,126,828 | 11/1978 | Kumagai . | |
| 4,206,317 | 6/1980 | Kahn . | |
| 4,654,884 | 3/1987 | Sakai | 455/183 |
| 4,811,423 | 3/1989 | Eastmond | 455/235.1 |
| 4,817,198 | 3/1989 | Renderle | 455/295 |
| 4,955,077 | 9/1990 | Sagayama | 455/236.1 |
| 5,203,019 | 4/1993 | Rinderle | 455/295 |
| 5,222,255 | 6/1993 | Kuo et al. | 455/295 |
| 5,303,413 | 4/1994 | Braegas . | |
| 5,339,455 | 8/1994 | Vogt et al. . | |

FOREIGN PATENT DOCUMENTS

| | | |
|---|---|---|
| 2803979A1 | 3/1978 | Germany . |
| 2812954A1 | 10/1979 | Germany . |
| 2250403 | 6/1992 | United Kingdom . |

OTHER PUBLICATIONS

*Motorola Microprocessor Data*, vol. 1, pp. iii, vii, viii & 3–712 published 1988 by Microprocessor Products Group, Austin, Texas.
*The Radio Amateur's Handbook*, American Radio Relay League, Newington, Conn., 1981 edition, pp. 9–8 and 9–18.

Primary Examiner—Reinhard J. Eisenzopf
Assistant Examiner—Lisa Charouel
Attorney, Agent, or Firm—Frishauf, Holtz, Goodman, Langer & Chick

[57] ABSTRACT

In a radio receiver with an input circuit which can be supplied with received signals, with a mixer for deriving an IF signal, and with an IF filter, the passband range corresponds to a usable signal range of the received signal, the received signals are amplitude-modified with an auxiliary signal for detecting intermodulation, in the course of which sidebands are generated outside of the useful signal range. The amplitudes of at least one sideband generated by modulation with the auxiliary signal and of the received carrier are compared in the IF signal. In case of deviations from a ratio based on the modulation factor during modulation with the auxiliary signal, a signal indicating the presence of intermodulation is derived.

13 Claims, 1 Drawing Sheet

RADIO RECEIVER WITH AN INTERMODULATION DETECTOR

Cross-reference to related patents and applications, assigned to the Blaupunkt Werke GmbH or its parent Robert Bosch Gmbh, the disclosures of which are hereby incorporated by reference: U.S. Ser. No. 07/657,399, Braegas, filed Jan. 18, 1991, now U.S. Pat. No. 5,303,413, issued Apr. 12, 1994; U.S. Ser. No. 07/979,610, VOGT et al., filed Nov. 20, 1992, now U.S. Pat. No. 5,430,890; and U.S. Ser. No. 08/021,029, VOGT, BARTELS, et al. filed Feb. 23, 1993, now U.S. Pat. No. 5,339,455, issued Aug. 16, 1994.

FIELD OF THE INVENTION

The invention relates generally to a radio receiver with an intermodulation detector.

BACKGROUND

Radio broadcasting is done in frequency band "channels" which, in Europe, are 9 kHz wide and, in North America, are 10 kHz wide. Each broadcast signal has 2 "sidebands" and sometimes the upper sideband of one transmitter's signal overlaps and interferes with the lower sideband of another transmitter's signal, e.g. when the second transmitter is using the adjacent higher channel.

Due to non-linearities, between the antenna and the mixer, in the signal path of signals to be received, "mixed products" arise from signals which are not intended to be received. Those mixed products, the frequency of which lies within the usable frequency range of the respectively selected transmitter, appear interferingly in the form of intermodulation.

The interference effect becomes more severe, the stronger the circuits containing the non-linearities are driven. Accordingly, the interference effect of intermodulation can be reduced by reducing the gain of the input circuit. However, to do this, it is necessary to determine whether intermodulation is present.

THE INVENTION

It is therefore an object of the present invention to provide a radio receiver in which intermodulation can be reliably detected, so that further steps can be taken.

The radio receiver of the invention has the advantage that, because of the possibility to detect interfering intermodulation, appropriate steps to reduce the interference are only taken if intermodulation is actually present. The gain in known radio receivers with Automatic Gain Control (AGC) is reduced at high input levels at which intermodulation per se can occur. This results in the desensitizing of the receiver, even in those cases in which no intermodulation occurs, in spite of a high gain level. One wants to avoid such unnecessary desensitizing.

It is advantageous, for the effect of the steps in accordance with the invention, that the modulation of the received signal by means of the auxiliary signal takes place as early as possible in the path of the received signal. Therefore, a further development of the invention provides that the input circuit contains a pre-selection stage with a controllable degree of damping, and that the auxiliary signal of the pre-selection stage can be supplied to the pre-selection stage for controlling the degree of damping.

Modulation can be performed, in a particularly simple manner, by superimposing the auxiliary signal on a voltage used for Automatic Gain Control (AGC). In the course of this, it has been shown to be advantageous if the modulation factor is 0.1 and the frequency of the auxiliary signal is 4 kHz.

The additional outlay caused by the steps of the invention can be kept low in that, for comparison of the amplitudes, the intermediate frequency signal can be supplied, not only to the Intermediate Frequency (IF) filter, but also to a further filter, the passband of which includes a sideband of the usable frequency range, and a sideband generated by modulation with the auxiliary signal, and that the amplitudes of the output signals of both filters are measured, and divided by each other.

The IF filter, which is present anyway, is used here for detecting the intermodulation, so that only one additional filter, and devices for measuring and dividing the amplitudes, are required. When using the output signal of the IF filter, the measurement of the amplitude of the carrier, however, is distorted by the sidebands within the usable frequency range. But this is compensated in that, when measuring the amplitude of the sideband generated by the modulation with the auxiliary carrier, a sideband of the usable frequency is also detected.

In another further development of the invention, it is provided that, for the received carrier and for at least one of the sidebands generated by the modulation by means of the auxiliary signal, respectively, one narrow-band filter is provided, and that the amplitudes of the output signals of the narrow-band filters are measured, and divided by each other.

Depending on the individual requirements, the extra outlay regarding the filters can be extremely low if, for example, the filters are implemented by using a digital signal processor (DSP).

In accordance with another further development of the invention, it has been provided that, besides a filter for the received carrier, one filter each is provided for the upper sideband and the lower sideband, which had been generated by modulation with the auxiliary signal, and that the signal identifying intermodulation is derived only if the ratio between the amplitudes of the received carrier and the lower sideband, as well as the ratio of the amplitudes between the received carrier and the upper sideband, deviate from the ratio given by the modulation factor.

This further development has the particular advantage that interference occurring outside the usual frequency range is not detected as intermodulation. Such interference could originate from a transmitter in an adjacent channel, for example, if it is received with a relatively high field strength in comparison with the received transmitter, or when, in the case of AM transmissions, its sidebands are not limited to the central frequency ±4.5 kHz, in accordance with European regulations, or ±5.0 kHz, in accordance with North American regulations.

DRAWINGS

Exemplary embodiments of the invention are illustrated in the drawings by means of several figures and are described in detail in the following description.

DETAILED DESCRIPTION

Figure 1:
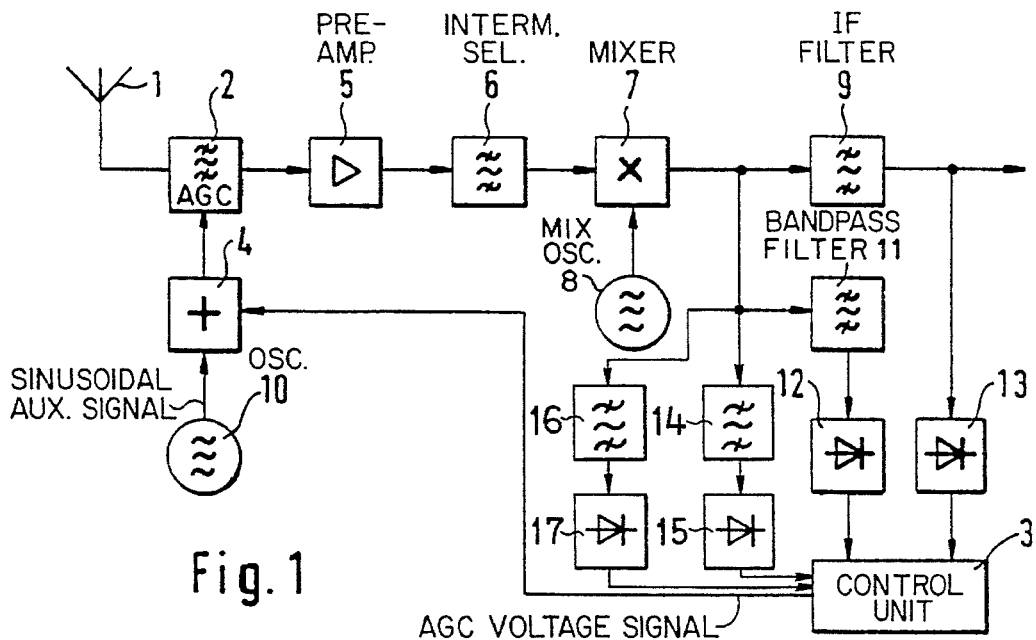
FIG. 1 is a block diagram of an exemplary embodiment.

FIG. 1 is a block diagram illustrating schematically the parts of a radio receiver, to the extent they are necessary for explaining the invention. The signals to be received are routed from an antenna 1 to a pre-selection stage 2 containing a bandpass filter with controllable damping. A pin diode is provided for this, in a manner known per se, which is connected to a control voltage hereinafter called AGC (Automatic Gain Control) voltage— for controlling the gain. The AGC voltage is supplied to the pre-selection stage 2 by a control unit 3, via an adder circuit 4.

A pre-amplifier 5 follows the pre-selection stage 2, the output signals of which are supplied via an intermediate selection stage 6 to a mixer 7. The mixer 7 is also provided with the output voltage of a mixing oscillator 8, so that an Intermediate Frequency (IF) signal, the bandwidth of which is limited to the usable frequency range by a following IF filter 9, is available, in a manner known per se, at the output of the mixer 7. The output signals of the IF filter 9 can be amplified and demodulated in a manner known per se, which is not illustrated in FIG. 1.

Figure 2:
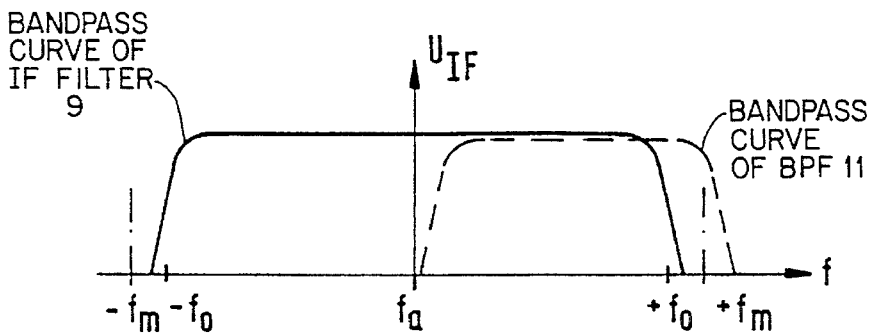
FIG. 2 illustrates passband curves for filters used in the first exemplary embodiment of FIG. 1.

The passband curve of the IF filter 9 is shown as a solid line in FIG. 2 and includes a usable frequency range which, in a standard European AM receiver, is approximately ±3.5 kHz above the carrier frequency or tuning frequency $f_a$ displaced into the IF range. The limits of the usable frequency range have been indicated by $+f_o$ or $-f_o$.

Figure 3:
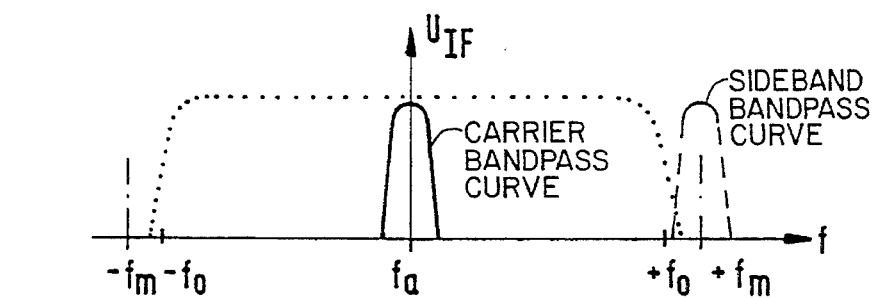
FIG. 3 illustrates passband curves of filters in a second exemplary embodiment.
Figure 4:
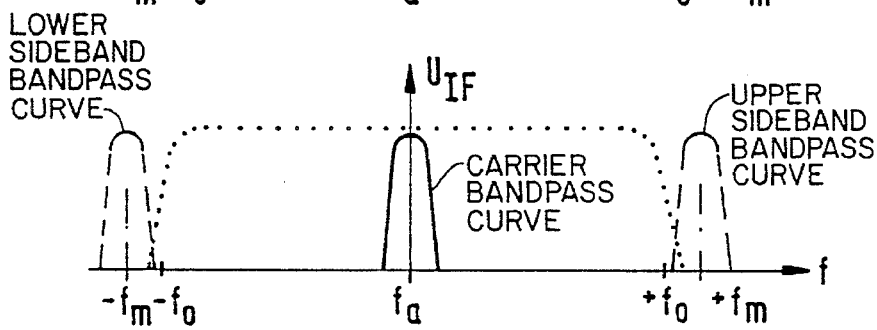
FIG. 4 illustrates passband curves of filters in a third exemplary embodiment.

To detect a possibly present intermodulation, in the exemplary embodiment of FIG. 1, a sinusoidal auxiliary signal generated in the oscillator 10 is superimposed on the AGC voltage in the adder circuit 4 and is provided together with it to the control input of the pre-selection stage 2. An amplitude modulation of the received signals is performed by means of this. This results in two sidebands in the IF signal, which are illustrated in FIGS. 2 to 4 by dash-dotted lines with the frequencies $+f_m$ and $-f_m$. Based on a pre-selected intermodulation factor, the amplitudes of the sidebands have a pre-selected relationship to the amplitude of the carrier.

However, if two transmitters, to which the radio receiver is not tuned, are located in the frequency range in such a way that their intermodulation product lies at the tuning frequency (for example 2 $f_1-f_2=f_a$), the amplitude difference between the carriers (at $f_a$) and the additional sidebands (at $f_a \pm f_m$) is less than with a transmitter received without intermodulation. Now, if an intermodulation product is "received", the amplitude difference with a modulation factor of 0.1 is approximately 10 dB less than with a transmitter without intermodulation interference.

For this reason, it is possible to determine, by filtering and amplitude comparison, whether this is an actual useful transmitter, or merely an undesired intermodulation product.

For this purpose, a second filter 11 for the IF signal is provided in the exemplary embodiment of FIG. 1, which has the bandpass curve shown by dashed lines in FIG. 2. The output signals of the additional filter 11 and the IF filter 9 are respectively supplied to amplitude measuring devices 12, 13, which essentially comprise respectively one amplitude modulator, the time constant of which is greater than the lowest modulation frequencies. The amplitude values determined in this way are supplied to the control unit 3, which is formed, for example, by a microprocessor with a suitable program, and divides the supplied signals by themselves and compares the amplitude ratio thus calculated with a set value or set range. Any of a number of INTEL, MOTOROLA, and SIEMENS processors are suitable. If the ratio is located below this range, a reduction in the AGC voltage is caused by the control unit 3.

Another narrow-band filter 14 and an associated amplitude measuring device 15 may be provided for the received carrier signal, as shown in FIG. 1. Still another narrow-band filter 16 and an associated amplitude measuring device 17 may be provided for a lower sideband, also as shown in FIG. 1.

A preferred control unit 3 is the MOTOROLA microcontroller MC68HC05. Pre-selection stage 2 is preferably a conventional commercially available AM pre-selection circuit. A preferred intermediate frequency (IF) is 450 kHz, and filter parameters are chosen with that in mind; if a different IF is used, those skilled in the art are able to make appropriate adjustments.

Filter 6 is preferably a broadband Cauer bandpass filter with 3 dB lower and upper limit frequencies of 150 kHz and 1610 kHz. Filter 9 is preferably a ceramic bandpass filter model SFR450H with a central frequency of 450 kHz and a 6 dB bandwidth of 8 kHz. Oscillator 10 preferably generates a 5 kHz signal. Filter 11 is preferably a ceramic bandpass filter model SFR455H with a central frequency of 450 kHz and a 6 dB bandwidth of 8 kHz. The detection of intermodulation is particularly desirable in connection with broadband AM transmissions, since the problem arises most severely under those circumstances.

Not only is the amplitude of the carrier measured in the exemplary embodiment of FIG. 1, but that of the entire useful signal. The distortion created by this, however, is again compensated in that, in place of the single sideband $+f_m$ or $-f_m$, the entire sideband is scanned, i.e. including the usable sideband. For this reason, the already present IF filter 9 can also be used for determining the amplitude ratio, so that only one additional filter 11 is required.

However, within the scope of the invention, it is easily possible to employ two narrow-band filters for selecting the carrier and one of the sidebands generated by the additional modulation to determine the amplitude ratios, as illustrated in FIG. 3. The curve in a solid line represents the selection curve for the carrier, the dashed curve that of the sideband. The bandpass curve of the IF filter is indicated by a dotted line.

FIG. 4 illustrates that it is furthermore possible, within the scope of the invention, to use three narrow-band filters for the selection of the carrier and both additional sidebands. This has the particular advantage that interferences which occur on one side outside the usable frequency range are not recognized as intermodulations. Such interference can, for example, come from a transmitter in an adjacent channel if it is received with a relatively large field strength in comparison to the received transmitter, or if its sidebands are not limited to ±4.5 kHz (in Europe) or ±5.0 kHz (in North America) in accordance with broadcasting regulations.

Various changes and modifications may be made, and features described in connection with any one of the embodiments may be used with any of the others, within the scope of the inventive concept.

For example, a suitable digital signal processor which can be used to implement the digital filters is model DSP 56 000 made or sold by MOTOROLA.

What is claimed is:

1. In a radio receiver comprising an input circuit which is supplied with received radio signals, a mixer (7) for deriving an intermediate frequency (IF) signal from the received radio signals, and an IF filter (9) coupled to receive the output of said mixer (7), the IF filter (9) having a passband range corresponding to a useful frequency range of the received signals, the improvement comprising:

means for amplitude-modulating the received radio signals with an auxiliary signal for detecting intermodulation, which generates sidebands outside of the useful frequency range;

a comparing unit for comparing the amplitude of at least one sideband generated by the amplitude with the auxiliary signal and the amplitude of a carrier of the received radio signals in the intermediate frequency (IF) signal; and an indication control unit for generating signal indicating a presence of the intermodulation when deviations, from a ratio based on the amplitude factor during modulation with the auxiliary signal, exceed a predetermined value.

2. The radio receiver of claim 1, wherein:

the input circuit comprises a pre-selection stage (2) with a controllable degree of damping; and the auxiliary signal is supplied to the pre-selection stage (2) for controlling the degree of damping.

3. The radio receiver of claim 1, wherein the auxiliary signal is superimposed on a voltage used for automatic gain control (AGC).

4. The radio receiver of claim 1, wherein the modulation factor is 0.1 and the auxiliary signal has a frequency of 4 kHz.

5. The radio receiver of claim 1, further comprising:

a second filter (11), the intermediate frequency signal being supplied to said second filter (11) and to the IF filter (9), said second filter (11) having a passband range which comprises a sideband of the useful frequency range and the at least one sideband generated by the amplitude-modulating with the auxiliary signal; and wherein the amplitudes of output signals of both said IF filter (9) and of said second filter (11) are measured and divided by each other in the control unit (3).

6. The radio receiver of claim 5, wherein at least the IF filter is formed by means of a digital signal processor which also performs the amplitude comparisons and the divisions.

7. The radio receiver of claim 6, wherein the second filter is formed by means of said digital signal processor.

8. The radio receiver of claim 1, further comprising:

a first narrow-band filter (14) provided for a carrier of the received radio signals;

a second narrow-band filter (11) provided for the at least one sideband generated by the amplitude-modulating with the auxiliary signal; and wherein the amplitudes of output signals of both said first and second narrow-band filters are measured and divided by each other in the control unit (3).

9. The radio receiver of claim 8, wherein:

said at least one sideband generated by the amplitude-modulating with the auxiliary signal includes an upper sideband and a lower sideband;

said second narrow-band filter (11) is provided for said upper sideband; and further comprising:

a third filter (16) provided for the lower sideband; and wherein the indication signal is generated by the control unit (3) only if a ratio between amplitudes of the received radio signals and the lower sideband, as well as a ratio of amplitudes between the received radio signals and the upper sideband, deviate from said ratio based on the modulation factor.

10. The radio receiver of claim 8, wherein at least the IF filter is formed by means of a digital signal processor which also performs the amplitude comparisons and the divisions.

11. The radio receiver of claim 10, wherein the first and second narrow-band filters are formed by means of said digital signal processor.

12. The radio receiver of claim 1, wherein the input circuit includes a pre-selection stage, and wherein a gain of the pre-selection stage is reduced when the intermodulation is present.

13. The radio receiver of claim 1, wherein at least the IF filter is formed by means of a digital signal processor.

* * * * *